United States Patent [19]

Sawada et al.

[11] Patent Number: 5,527,501
[45] Date of Patent: Jun. 18, 1996

[54] PROCESS FOR PRODUCING PIEZOELECTRIC CERAMIC SHEET AND DIELECTRIC CERAMIC SHEET

[75] Inventors: Yasushi Sawada, Aichi; Eturo Yasuda, Okazaki; Hiroshi Matuoka, Anjo; Michihiro Wakimoto, Okazaki; Masahiro Tomita, Anjo; Yoshinori Nakayama, Okazaki, all of Japan

[73] Assignee: Nippon Soken Inc., Nishio, Japan

[21] Appl. No.: 238,333

[22] Filed: May 4, 1994

Related U.S. Application Data

[63] Continuation of Ser. No. 903,707, Jun. 24, 1992, abandoned.

[30] Foreign Application Priority Data

Jun. 25, 1991 [JP] Japan ................................ 3-179017
Jun. 4, 1992 [JP] Japan ................................ 4-144177

[51] Int. Cl.⁶ .................................................. F27B 9/14
[52] U.S. Cl. ................................................ 264/57; 264/58
[58] Field of Search ............................... 156/89; 264/57, 264/58, 65

[56] References Cited

U.S. PATENT DOCUMENTS

| | | | |
|---|---|---|---|
| 4,019,915 | 4/1977 | Miyauchi et al. | 264/65 |
| 4,078,938 | 3/1978 | Yonezawa et al. | 156/89 |
| 4,255,272 | 3/1981 | Ogawa | 264/65 |
| 4,766,671 | 8/1988 | Utsumi et al. | 156/89 |
| 5,085,720 | 2/1992 | Mikeska et al. | 264/56 |

FOREIGN PATENT DOCUMENTS

| | | |
|---|---|---|
| 41-002099 | 2/1966 | Japan . |
| 41-002100 | 2/1966 | Japan . |
| 43-010713 | 5/1968 | Japan . |
| 44-018029 | 8/1969 | Japan . |
| 45-023262 | 8/1970 | Japan . |

OTHER PUBLICATIONS

Principles of Materials Science And Engineering, William F. Smith pp. 567–568 McGraw–Hill 1986.

Primary Examiner—Christopher A. Fiorilla
Attorney, Agent, or Firm—Cushman, Darby & Cushman

[57] ABSTRACT

A method for preparing a piezoelectric or dielectric ceramic sheet by firing a shaped body made of a piezoelectric or dielectric ceramic powder while the shaped body is sandwiched between substrates. The method results in a significant improvement in the degree of displacement of a piezoelectric ceramic and significantly decreased warpage of the shaped body during sintering.

9 Claims, 5 Drawing Sheets

← 10 μm (WHITE LINE)

PROCESS FOR PRODUCING PIEZOELECTRIC CERAMIC SHEET AND DIELECTRIC CERAMIC SHEET

This is a continuation of application Ser. No. 07/903,707, filed on Jun. 24, 1992, which was abandoned upon the filing hereof.

BACKGROUND OF THE INVENTION

1. Field of the Invention

The present invention relates to a process for producing a piezoelectric ceramic sheet and a dielectric ceramic sheet used as an electrical part.

2. Description of Related Art

An improvement in the degree of displacement is desirable for a material, when a piezoelectric ceramic is utilized as an actuator, and accordingly, such an improvement has been generally made in the art through studies of the composition of the material. Specifically, the studies began with the use of barium titanate, and the discovery of a large electromechanical coupling factor in a $PbTiO_3$-$PbZrO_3$ system has led to remarkable advances in the practicability thereof. Further, after a proposal of a $PbTiO_3$-$PbZrO_3$-$Pb(Mg_{1/3}Nb_{2/3})O_3$ system, investigations of the effect of various third components and additives have been conducted and have produced excellent results. In recent years, however, no particular improvement has been made in the art.

On the other hand, an attempt has been made to obtain an improvement in the degree of displacement through an increase in the orientation of the crystal without a change in the composition. For example, when a particle having an anisotropic shape is molded, the molded body becomes orientated. Nevertheless, when the molded body is fired, the orientation is lost, and thus no improvement in the performance can be realized.

Accordingly, an object of the present invention is to provide a process for producing a piezoelectric ceramic sheet having an improved degree of piezoelectric displacement.

Another object of the present invention is to provide a process for producing a Pb-based dielectric ceramic having an improved dielectric constant.

SUMMARY OF THE INVENTION

To attain the above-described object, the present invention provides a process for producing a piezoelectric ceramic sheet, which comprises sandwiching a shaped body comprising a piezoelectric ceramic powder between substrates and firing the resultant laminate.

Further, the present invention provides a process for producing a dielectric ceramic sheet, which comprises sandwiching a green sheet or a pressed powder body of a dielectric ceramic powder between the substrates and firing the resultant laminate.

DESCRIPTION OF THE PREFERRED EMBODIMENTS

Figure 1:
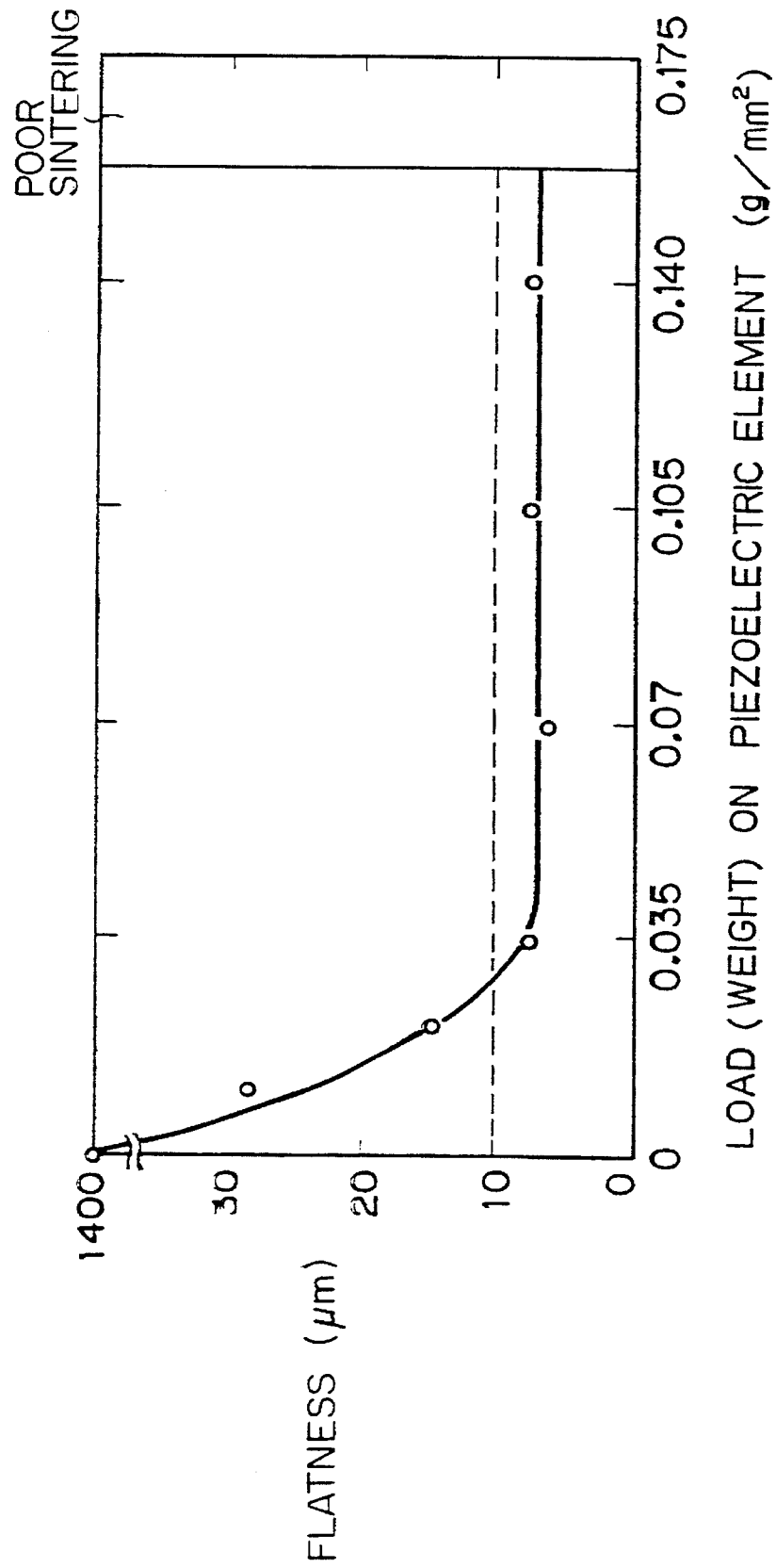
FIG. 1 is a graph showing the relationship between the load of a piezoelectric element and the flatness of an element of a substrate.

The firing in the process of the present invention contributes to a significant improvement in the degree of displacement of a piezoelectric ceramic. Further, when the weight of the substrate is regulated, the accuracy of the shape after sintering becomes so high that the sintered body can be commercially produced without machining, which contributes to a significant reduction in the cost. The improvement in the degree of displacement of the piezoelectric ceramic is derived from the progress of the sintering. This also contributes to 10 an improvement in the dielectric constant of ceramic, and this firing method according to the present invention is useful also for the production of a Pb-based dielectric ceramic for a capacitor.

Example of the piezoelectric ceramic to which the present invention is applicable include a $PbTiO_3$-$PbZrO_3$ system and a ternary system of the binary system i.e., $PbTiO_3$-$PbZrO_3$, and added thereto, $Pb(B_1, B_2)O_3$ wherein $B_1$ represents Mg, Ni, Y, Co or Mn and $B_2$ represents Nb, Ta or W.

Examples of the Pb-based dielectric ceramic for a capacitor to which the present invention is applicable include binary systems and ternary systems comprising combinations of $Pb(Zn, Nb)O_3$, $Pb(Mg, Nb)O_3$, $Pb(Mg, W)O_3$, $Pb(Fe, W)O_3$ and $Pb(Ni, W)O_3$.

Further, part of the Pb component constituting the above-described composition may be replaced with at least one member selected from the group consisting of Sr, Ba, Ca, K, Bi and La.

The ceramic to which the firing according to the present invention is applicable is a paraelectric, ferroelectric or antiferroelectric ceramic. In particular, in a Pb-containing system, since the evaporation of PbO is significant during firing, if the lead atmosphere is not closely controlled, the composition ratio is broken, which unfavorably lowers the properties. In the firing according to the present invention, the evaporation of PbO is suppressed, and due to this function, a solid-liquid phase reaction is attained which contributes to an acceleration of the grain growth and an improvement in the properties, so that the effects of the present invention become significant.

The green sheet of these ceramics can be prepared according to the conventional process. Specifically, besides a powder of a piezoelectric ceramic or a dielectric ceramic, a mixture of metal compounds (particularly oxides) which becomes a ceramic having the above-described composition upon being fired may be used for the ceramic powder. The ceramic powder is mixed with a binder, a solvent, and if necessary, additives such as a release agent, an antifoaming agent and a dispersant, to prepare a slurry. The composition of the present invention can comprise the above-described components in any proportion commonly used in the art.

When use is made of a mixture of the components rather than the calcined powder, since Pb or the like has a high vapor pressure and is liable to evaporate during firing, it is preferred to use Pb or the like in an excess amount higher than the stoichiometric ratio, more preferably in an excess of 0.5 to 2.0% by weight higher than the stoichimetric ratio.

The slurry may be cast by a doctor blade or the like into a green sheet, from which a pellet is stamped out. Alternatively, the slurry may be dried by a spray drier to give a powder, which is then press-molded by a pressing machine to form a pellet having a thickness of 0.50 to 1.0 mm.

The thickness of the green sheet may be 0.05 to 0.5 mm. When the thickness is too large, the viscosity of the slurry becomes so high that air bubbles remain in the green sheet.

Thereafter, the resultant shaped body is sandwiched between substrates, and the laminate is placed in a firing furnace. The substrate may be MgO, $ZrO_2$ and $Al_3O$, etc. Among them, MgO is preferred due to its good corrosion resistance to a PbO atmosphere.

Preferably these substrates have a MgO content of 99.9% by weight or more because, when the MgO content is 99.9% by weight or more, it becomes possible to prevent impurities (for example, Si) etc., contained in the substrate from thermally diffusing into the piezoelectric material, to thus spoil the piezoelectric properties.

Further, when the MgO content of the substrate is 99.9% by weight or more, it becomes possible to prevent bonding between the substrate and the element due to the inclusion of impurities.

The weight of the substrate is preferably from 0.03 to 0.15 $g/mm^2$ per unit area of the green sheet. As shown in FIG. 1, when the weight is smaller than this range, the accuracy of shaping of the fired element is lowered, and when the weight is larger than this range, a good element cannot be prepared due to cracking during firing.

The condition enables the accuracy of the surface of the ceramic sheet after firing to be kept at a desired value. In particular, the flatness (surface waviness) of the element can be kept within 10 μm. The term "flatness of element" used herein is intended to mean the difference between the minimum and maximum heights of the warpage of the element when a probe is moved over the diameter of the element.

The porosity of the substrate is preferably 20 to 30%.

According to extensive and intensive studies conducted by the present inventors, when the substrates for sandwiching the shaped body of a ceramic powder therebetween are dense, it becomes difficult to release a decomposed gas from the shaped body during the evaporation of the binder contained in the shaped body, due to a thermal decomposition, so that a thermal expansion occurs within the element which causes a cracking of the shaped body.

For the above-described reason, the higher the porosity of the substrate, the better the results. The porosity of the substrate is preferably 20% or more.

When the porosity is too high, since the surface roughness of the substrate is transferred to the sinter, the surface roughness of the substrate per se is unfavorable to the porosity, and this unfavorably deteriorates the surface roughness of the sintered body. For this reason, the porosity of the substrate is preferably less than 30%.

The firing condition may be fundamentally the same as that in the case of the conventional ceramic green sheet, but the holding time around the maximum temperature should be relatively long for attaining a homogeneous internal sintering.

Typically, after degreasing at 600° C., heating is conducted at 1150°to 1250° C. for 4 to 10 hr.

The present inventors further conducted extensive and intensive studies, and a result, found the following.

Specifically, in a ceramic containing at least Pb, since the sintering shrinkage behavior varies depending upon the temperature region, it is necessary to properly control the temperature elevation rate in each temperature region. For this reason, even when the above-described requirements are satisfied, since firing cracking may occur due to a difference of the sintering shrinkage in a temperature region in which the shrinkage per unit temperature elevation is large, the temperature elevation rate should be made lower than that in the other regions.

The firing is conducted in the air or in an oxygen atmosphere. To prevent an evaporation of a component having a high vapor pressure (Pb or the like) and attaining a homogeneous sintering, it is preferable to use a hermetically sealed atmosphere and dispose a source for the component having a high vapor pressure (for example, PbO) in the hermetically sealed atmosphere.

The ceramic sheet thus prepared has been sintered in such a state that the shape of sintered grains cannot be distinguished in the section of a broken ceramic (transgranular broken state) and thus if the composition is identical, the piezoelectric displacement or dielectric constant is improved. Further the accuracy of the shape (flatness, roundness, surface roughness, etc.) of the ceramic sheet after firing are excellent when the weight of the substrate is controlled.

Although the reason why the degree of piezoelectric displacement (and dielectric constant) is improved by the firing according to the present invention is not known, it is believed to be as follows.

It is generally considered that, in a polycrystal like a piezoelectric ceramic, the grain boundary (impurity or lattice defect) restrains the rotation of spontaneous polarization to constrain the displacement. On the other hand, in a single crystal wherein the crystal axes are orientated, since no displacement constraint exists, it is expected that the degree of displacement of the material can be at a maximum. To date, however, it has been difficult to prepare a single crystal having a size suitable for practical usage.

From observation of broken-out sections, it has been confirmed that the grains in the product of the present invention have a larger size than that of a sintered body produced by the conventional solid phase reaction. The larger the grain size, the smaller the proportion of grain boundary in the volume of the sinter. That is, the degree of constraint of the rotation of spontaneous polarization also becomes so small that a better displacement can be attained. Therefore, in the product of the present invention, the degree of displacement is high.

The reason why the above-described sintered state can be attained in the sintered body of the present invention is as follows. The sandwiching between substrates causes a lead compound (particularly a phase comprising PbO and other components such as Zr and Ti) in the composition to be fused and deposited at the grain boundary without sublimation. At that grain boundary, a solid-liquid phase reaction facilitates the diffusion of the substance, so that grains having a larger size than 10 that obtained in the conventional solid phase reaction are grown.

EXAMPLES

Example 1

For example, a solid solution comprising $PbTiO_3$ or $PbZrO_3$ and, dissolved therein, $Pb(Co_{1/3}Nb_{2/3})O_3$, $Pb(Zn_1/$ $3Nb_{2/3})O_3$, $Pb(Ni_{1/3}Nb_{2/3})O_3$, $Pb(Y_{1/2}Nb_{2/3})O_3$ or the like, or $PbTiO_3$ or $PbZrO_3$ doped with $Nb_2O_5$, $WO_3$ or the like, or a composition wherein part of Pb of the above-described composition is replaced with Sr, were used as the material for piezoelectric sheet. In this case, blending was conducted so that, while considering the evaporation of Pb, the amount of Pb was in an excess of 1 to 2% by weight over the stoichiometric ratio of the composition.

The components were dry-blended with each other by means of a blender (Hi-X200 manufactured by Nisshin Engineering Co., Ltd.), and the blend was calcined at 800° to 950° C.

Ion-exchanged water was added in an equal weight to the calcined powder to prepare a slurry, and the slurry was subjected to wet milling in a pearl mill (manufactured by Ashizawa K.K.) until the mean particle diameter becomes 0.5 μm or less.

2 to 10% by weight (on a solid basis), based on the weight of the ceramic powder, of a water-soluble binder (Ceramo TB manufactured by Dai-ichi Kogyo Seiyaku Co., Ltd.) was added thereto. Further, 0.5 to 1% by weight of a release agent (Ceramo R manufactured by Dai-ichi Kogyo Seiyaku Co., Ltd.) for enhancing the releasability of the polyester film from the green sheet and 0.01 to 0.05 % by weight of an anti-foaming agent (Anti-foam manufactured by Dow Corning) for facilitating the defoaming of the slurry were added thereto, and these were blended and dispersed in each other by a pearl mill.

Thereafter, the dispersion was subjected to vacuum defoaming in vacuum equipment while agitating by an agitator. A green sheet was then cast from the slurry on a polyester film by a doctor blade unit.

Figure 2:
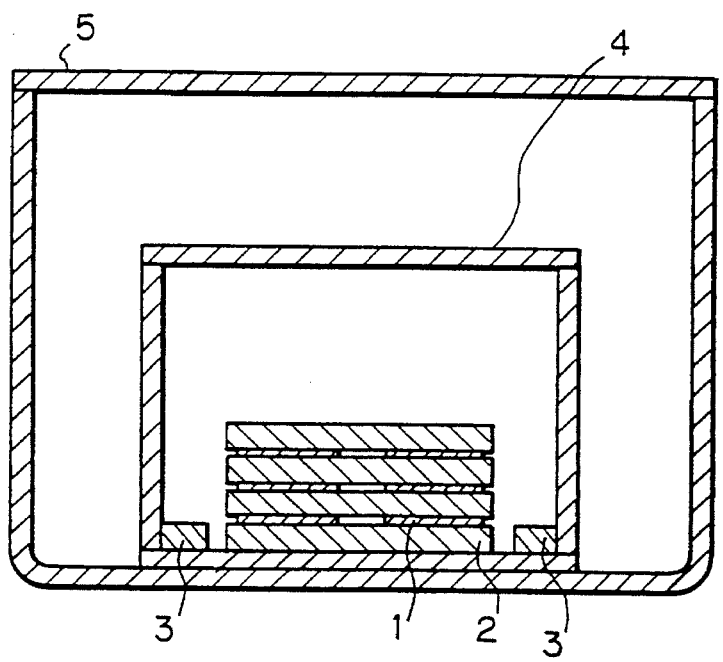
FIG. 2 is a diagram showing the firing in a working example.

A predetermined shape was stamped out of the green sheet by means of a pressing machine to give an element. As shown in FIG. 2, five sheets of the element 1 were respectively sandwiched between high-purity MgO substrates (manufactured by Ube Industries, Ltd.) 2, and the resultant laminate was fired.

When the substrate comprises this material, a good firing can be conducted because the substrate does not react with the element during firing and a change in the composition of the element does not occur.

The weight of the substrate is preferably from 0.03 to 0.15 g/mm² of the area of the element. When the weight is smaller than the above range, the accuracy of shape of the element after firing is lowered, and when the weight is larger than the above range, firing cracking occurs. The substrate has a MgO content of 99.9% by weight and a porosity of 25%.

Five sheets of the elements were set in containers 4 and 5 and a mixture 3 of $PbZrO_3$ and PbO in a weight ratio of 1:1 was placed within the crucibles 4 and 5 for the purpose of preventing the evaporation of Pb from the element through the control of the Pb atmosphere. The containers have a double structure for preventing the atmosphere from leaking into the outside of the system. A Mg container is used as the inner container 4 for preventing the absorption of Pb. The material for the outer container 5 is not particularly limited. In this example, use was made of an Al container, which has a low cost.

The maximum firing temperature was 1180° to 1250° C.

Figure 4A:
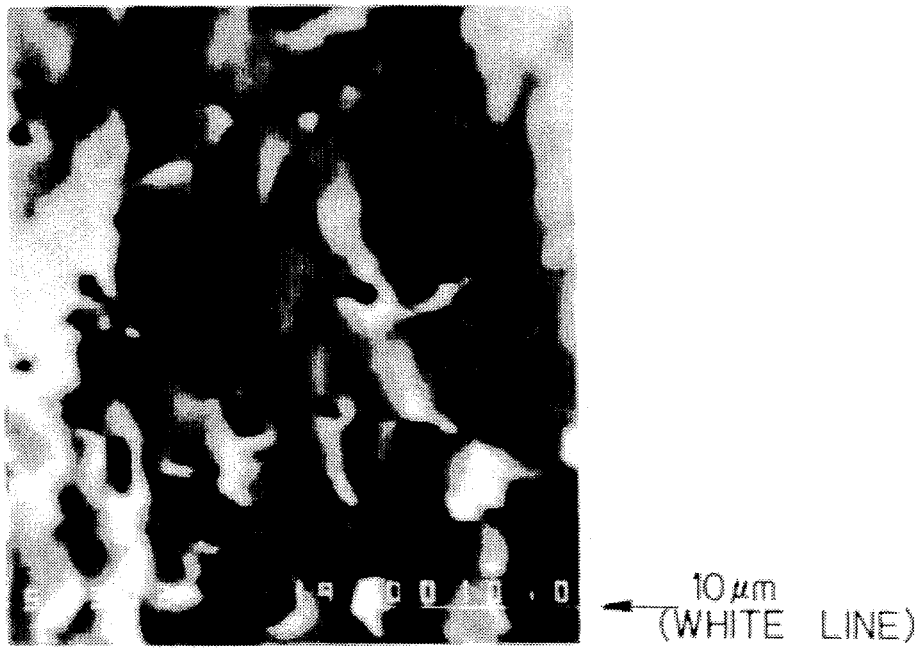
FIGS. 4A and 4B are sectional SEM photograph showing a crystalline structure of fired products prepared in examples and comparative Examples.
Figure 4B:
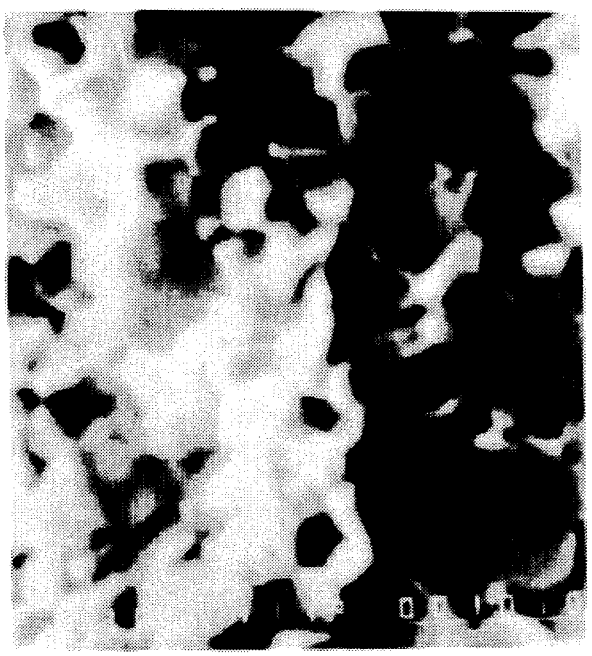

The section of the piezoelectric element thus prepared and then broken-out was observed under SEM, and the SEM photograph is shown in FIG. 4A. For comparison, 10 a SEM photograph of an element prepared in the same composition by the conventional bulk firing process is shown in FIG. 4B.

As shown in the photograph, in the broken-out section of the element prepared by the conventional bulk firing process, the shapes of the gains and the boundaries thereof were clearly observed, whereas in the element prepared according to the process of the present invention, neither the shape of the grains nor their boundaries is observed and transgranular breaking appears to occur.

Figure 5:
FIG. 5 is a sectional SEM photograph showing a crystalline structure after reheating of a fired product prepared in an example.

FIG. 5 shows an SEM photograph of a broken-out section of a ceramic element made in accordance with the procedures of Example 1, in which the firing was conducted under conditions of a maximum temperature of 1180° to 1200° C. and a holding time of 1 to 2 hr. It is confirmed that the grain size of the product according to the present invention (FIG. 5) is twice that of the product prepared by the bulk baking process (FIG. 4B).

Figure 3:
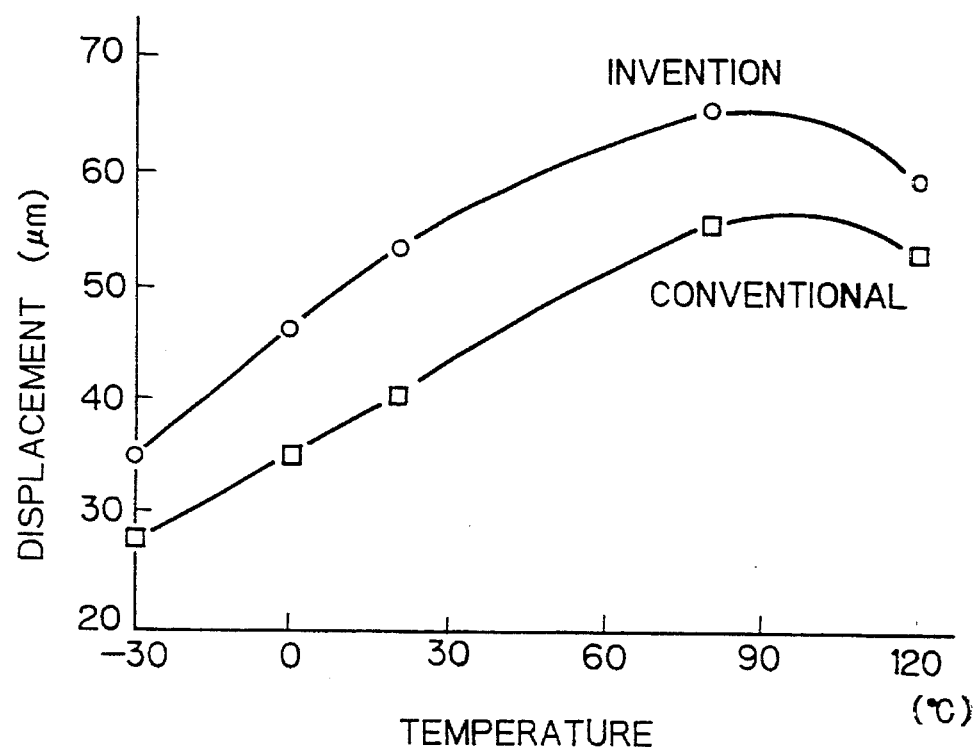
FIG. 3 is a graph showing the degree of displacement of a fired piezoelectric ceramic.

A laminate actuator as described in Japanese Unexamined Patent Publication (Kokai) No. 63-56971 (Japanese Patent Application No. 200111/1986) was prepared from this element and subjected to measurement of the dependency of the degree of displacement upon the temperature. The results are shown in FIG. 3. For comparison, the degree of displacement with respect to an actuator comprising the element prepared by the bulk baking process is also shown in FIG. 3.

From these results, it was found that, in the fired element according to the present invention, it is possible to attain an improvement of the degree of displacement by about 1.3 times in the whole temperature range. Further, the dielectric constant was improved from 2000 to 2800.

Further, according to the firing of the present invention, a flatness of 10 μm, a roundness of 200 μm and a surface roughness of 3 μmRz (each based on a diameter, φ, of 16 mm and a thickness, t, of 0.25 mm) could be obtained as the accuracy of the shape after firing. That is, the accuracy sufficed for a practical use of the element as an actuator without machining.

Example 2

$PbLaZrTiO_3$ was used as a capacitor material, and a green sheet was formed in the same manner as that used in the case of the PZT piezoelectric sheet of Example 1. The green sheet was sandwiched between MgO substrates, and the laminate was fired at a maximum temperature of 1100° to 1200° C.

Figure 6:
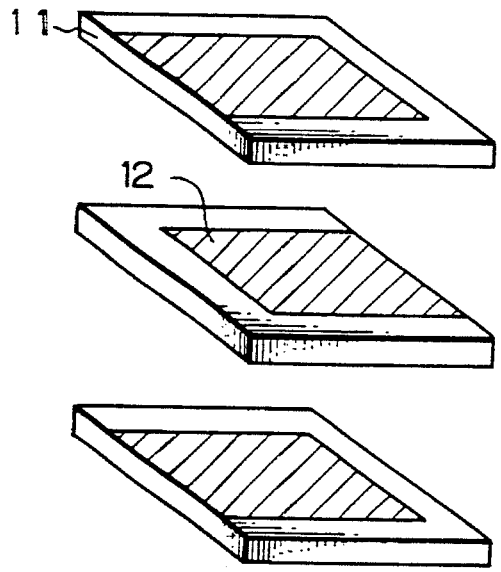
FIG. 6 is a perspective view of elements constituting a laminate capacitor.

As shown in FIG. 6, one surface of the sintered PLZT element was printed with a silver paste 12, and a plurality of printed elements were put on top of another in such a manner that the non-printed edges are alternately oppositely located. The resultant laminate was subjected to hot pressing under conditions of a temperature of 600° to 650° C. and a pressure of 2 to 4 kg/cm² to bind with each other.

Figure 7:
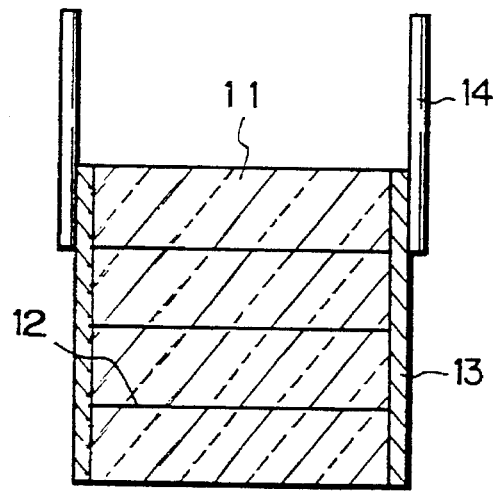
FIG. 7 is a cross-sectional view of a laminate capacitor.
Figure 8:
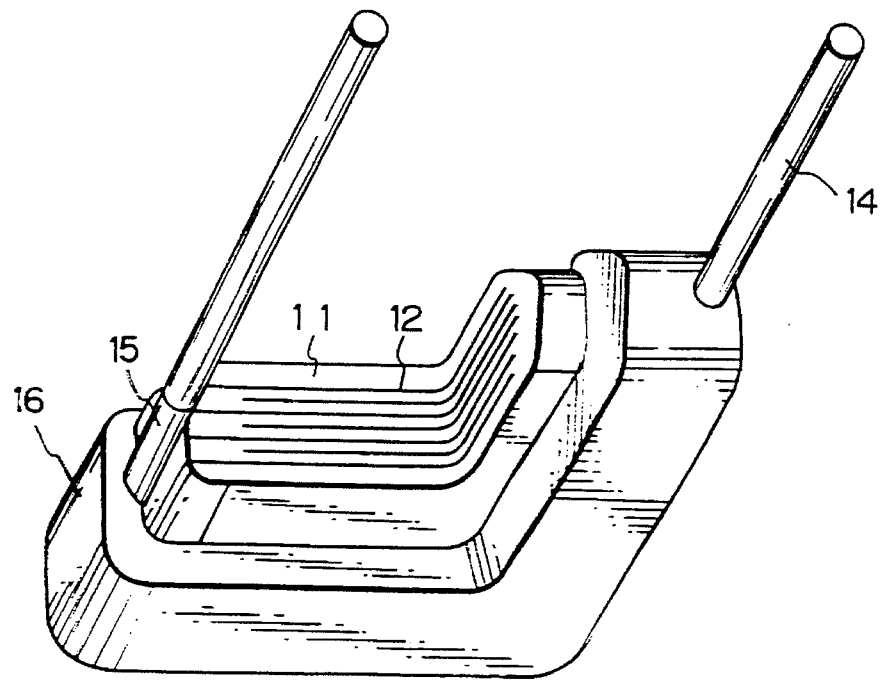
FIG. 8 is a perspective view of a completed laminate capacitor.

Further, as shown in FIG. 7, a silver paste 13 was printed on the side face of the laminate and baked at 600 to 650° C., and lead wires 14 were soldered 15 thereto. This assembly was subjected to insulation coating 16 with an epoxy resin or the like to give a capacitor of the present example shown in FIG. 8.

This capacitor exhibited a dielectric constant of 3000, that is, an improvement of 1.5 times of the dielectric constant over the capacitor prepared in the same manner as that of the present example, except that it was not sandwiched with MgO substrate.

Example 3

In the present example, the procedure up to the wet pulverization of the calcined product was conducted in the same manner as that of Example 1.

Thereafter, in the present example, a 10% aqueous solution of PVA (polyvinyl alcohol) as an organic binder was added in an amount of 2 to 5% by weight to the wet pulverized slurry, and they were sufficiently blended and pulverized by means of a ball mill.

The slurry was dried by a spray drier, and the resultant powder was formed into a pellet having a desired size by a press machine.

Thereafter, ceramic sheets of the present example were prepared in the same manner as that of example 1.

As a result, as in Example 1, ceramic sheets having excellent effects were obtained.

In the above-described examples, five sheets of elements were sandwiched between substrates, and the laminate was fired. The preset invention, however, is not limited to these examples, and a single sheet of element may be sandwiched between substrates. In particular, when a single sheet of element is sandwiched between substrates, since a single dimensional tolerance can be provided, it becomes possible to prepare a ceramic sheet having a more accurate desired dimension.

The use of the above-described process enabled machining as a subsequent step to be eliminated.

As described above, the present invention can improve the degree of dielectric displacement of a piezoelectric ceramic and the dielectric constant of a ceramic for a capacitor.

We claim:

1. A process for producing at least one piezoelectric ceramic sheet comprising the steps of:

sandwiching at least one green sheet comprising a piezoelectric ceramic powder between substrates that do not react with said green sheet during firing to produce a laminate, wherein each green sheet has one substrate in contact with each side of the green sheet whereby if more than one green sheet is present the green sheets and substrates are stacked alternately, said substrates each have a smooth surface in contact with the green sheet sandwiched between them, said substrates comprise a porous MgO having a porosity of 20 to 30% and said substrates have a weight between 0.03 and 0.15 g/mm$^2$ per unit area of said green sheet, and wherein said piezoelectric ceramic powder is selected from the group consisting of a $PbTiO_3$-$PbZrO_3$ binary system and a ternary system of $PbTiO_3$-$PbZrO_3$-$Pb(B_{1(1-x)}B_{2(x)})O_3$, wherein $B_1$ represents Mg, Ni, Y, Co, or Mn, and $B_2$ represents Nb, Ta or W, and $(X)+(1-X)=1$;

firing the resulting laminate to sinter said at least one green sheet to obtain at least one piezoelectric ceramic sheet having a high degree of piezoelectric displacement; and separating the at least one piezoelectric ceramic sheet from said substrates, and wherein the surfaces of the at least one ceramic sheet which were in contact with said smooth surfaces of the substrates have sufficient smoothness to not require further mechanical finishing.

2. A process for producing a piezoelectric ceramic sheet according to claim 1, wherein part of Pb constituting part of the piezoelectric ceramic powder of the ternary system is substituted by at least one member selected from the group consisting of Sr, Ba, Ca, K, Bi and La.

3. A process for producing a piezoelectric ceramic sheet according to claim 1, wherein said substrates have a MgO content of not less than 99.9% by weight.

4. A process for producing a piezoelectric ceramic sheet according to claim 1, wherein said substrates are sufficiently rigid to prevent said green sheet from warping during sintering.

5. The process according to claim 1, wherein one green sheet is sintered and on each side of the green sheet there is only one porous MgO substrate and the green sheet is free of other substrates.

6. A sintering process for increasing the dielectric constant of at least one dielectric ceramic sheet comprising the steps of:

sandwiching at least one green sheet comprising a dielectric ceramic powder between substrates that do not react with said green sheet during firing to produce a laminate, wherein each green sheet has one substrate in contact with each side of the green sheet whereby if more than one green sheet is present the green sheets and substrates are stacked alternately, said substrates each have a smooth surface in contact with the green sheet sandwiched between them, said substrates comprise a porous MgO having a porosity of 20 to 30% and said substrates have a weight between 0.03 and 0.15 g/mm$^2$ per unit area of said green sheet, and wherein said dielectric ceramic powder is selected from the group consisting of $Pb(Zn_{(1-x)}Nb_{(x)})O_3$, $Pb(Mg_{(1-x)}Nb_{(x)})O_3$, $Pb(Mg_{(1-x)}W_{(x)})O_3$, $Pb(Fe_{(1-x)}W_{(x)})O_3$, $Pb(Ni_{(1-x)}W_{(x)})O_3$ wherein $(X)+(1-X)=1$ and mixtures of metal compounds which form said compounds;

firing the resulting laminate to sinter said at least one green sheet to obtain at least one dielectric ceramic sheet; and separating the at least one dielectric ceramic sheet from said substrates, and wherein the surfaces of the at least one ceramic sheet which were in contact with said smooth surfaces of the substrates have sufficient smoothness to not require further mechanical finishing.

7. A process for producing a piezoelectric ceramic sheet according to claim 6, wherein part of the Pb component constituting part of the Pb-based dielectric ceramic is substituted by at least one member selected from the group consisting of Sr, Ba, Ca, K, Bi and La.

8. A process for producing a piezoelectric ceramic sheet according to claim 6, wherein said substrates are sufficiently rigid to prevent said shaped body from warping during sintering.

9. The process according to claim 6, wherein one green sheet is sintered and one each side of the green sheet there is only one porous MgO substrate and the green sheet is free of other substrates.

* * * * *